United States Patent
Wyland et al.

[19]

[11] Patent Number: 6,111,199
[45] Date of Patent: Aug. 29, 2000

[54] INTEGRATED CIRCUIT PACKAGE USING A GAS TO INSULATE ELECTRICAL CONDUCTORS

[75] Inventors: Christopher P. Wyland, Morgan Hill; Richard L. Guilhamet, Los Gatos, both of Calif.

[73] Assignee: Integrated Device Technology, Inc., Santa Clara, Calif.

[21] Appl. No.: 09/057,015

[22] Filed: Apr. 7, 1998

[51] Int. Cl.[7] .................................................. H01L 23/28
[52] U.S. Cl. ...................... 174/52.2; 174/52.1; 361/752; 257/682; 257/693; 257/704
[58] Field of Search ................... 174/52.4, 52.3, 174/52.2; 257/693, 682, 774, 704, 721; 361/774, 752, 736

[56] References Cited

U.S. PATENT DOCUMENTS

| | | | |
|---|---|---|---|
| 5,261,157 | 11/1993 | Chang | 29/844 |
| 5,299,097 | 3/1994 | Kondo et al. | 361/813 |
| 5,403,784 | 4/1995 | Hashemi et al. | 437/217 |
| 5,538,433 | 7/1996 | Arisaka | 439/70 |
| 5,554,824 | 9/1996 | Ueda et al. | 174/52.4 |
| 5,650,592 | 7/1997 | Cheskis et al. | 174/52.4 |
| 5,733,639 | 3/1998 | Gosselin | 428/209 |
| 5,890,284 | 4/1999 | Chartrand et al. | 29/853 |

*Primary Examiner*—Kristine Kincaid
*Assistant Examiner*—W. David Walkenhorst
*Attorney, Agent, or Firm*—Skjerven Morrill Macpherson Franklin & Friel

[57] ABSTRACT

An integrated circuit package includes a number of electrical conductors that are completely or at least partially surrounded by a gas instead of a solid material (having no cavities) used in the prior art. Such use of a gas reduces the dielectric constant in a region around each of the electrical conductors, as compared to the dielectric constant of a solid dielectric material. In one implementation, a number of leads are kept separated from a substrate by a number of electrically conductive support members attached to the substrate. Each lead is electrically coupled (e.g. by a bond wire) to a die pad on a die that is supported by the package in the normal manner. The leads are initially formed as portions of a lead frame (e.g. by etching or stamping), and are held separate from each other by the respective support members. The support members are electrically coupled (e.g. by traces and vias in the substrate) to terminals (e.g. pins, balls or lands) of the package. The substrate of such a package can be formed of a non-solid material, such as a foam (e.g. of polyimide) or a mesh (e.g. of graphite strands).

22 Claims, 6 Drawing Sheets

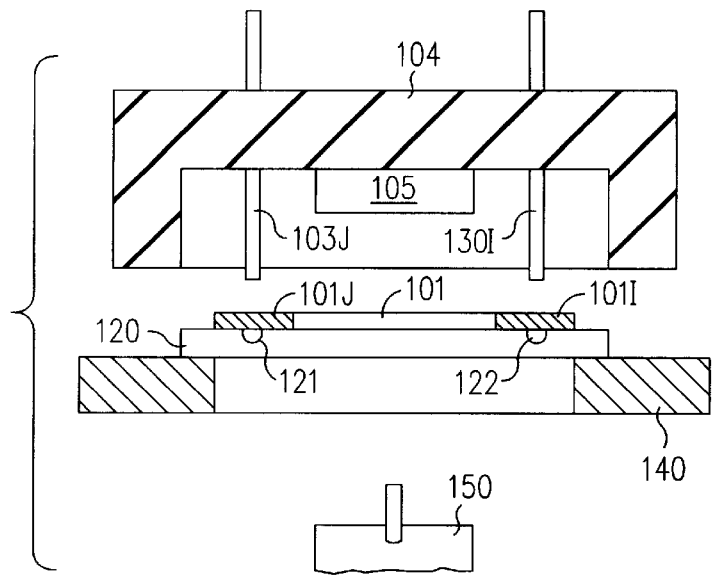
FIG. 2F
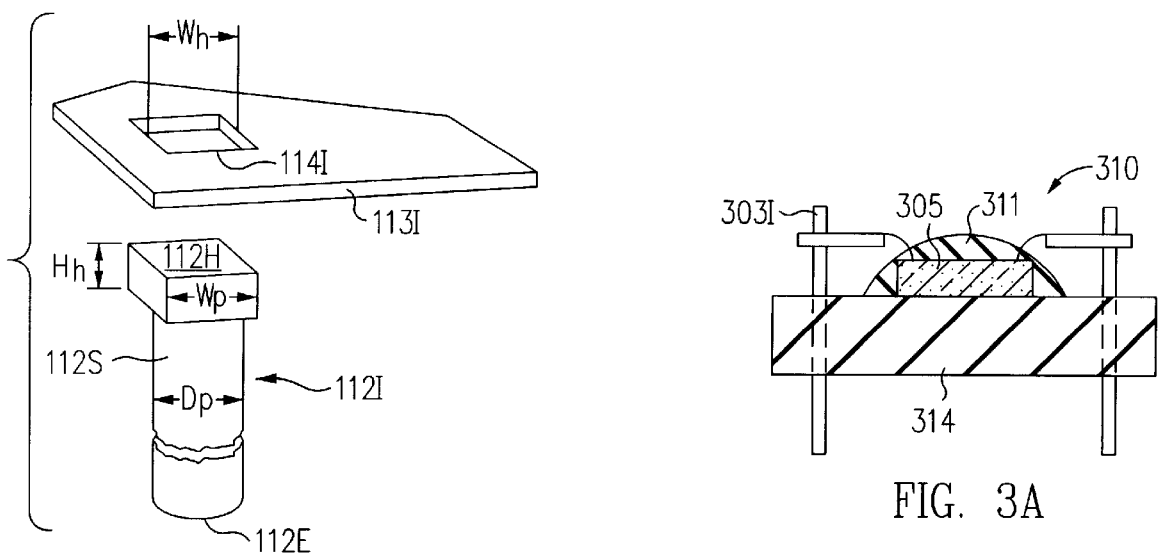
FIG. 2G
FIG. 3A
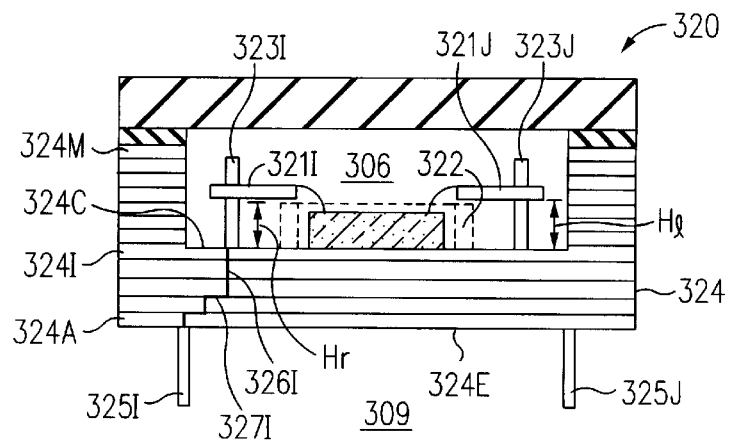
FIG. 3B

INTEGRATED CIRCUIT PACKAGE USING A GAS TO INSULATE ELECTRICAL CONDUCTORS

FIELD OF THE INVENTION

This invention relates to a dielectric material that insulates electrical conductors in an integrated circuit package.

BACKGROUND OF THE INVENTION

A pin grid array package of the prior art can have pins 2A–2K (FIG. 1A) that are straight and that pass through a substrate 1 (as described at col. 2, line 66 to col. 3, line 29 of U.S. Pat. No. 5,538,433 granted to Arisaka).

Another pin grid array package 10 (FIG. 1B) disclosed by U.S. Pat. No. 5,403,784 granted to Hashemi et al. (hereinafter the "Hashemi Patent") supports a die 11 that is connected by bond wires 12A–12K to a corresponding number of leads 13A–13K included in package 10. Leads 13A–13K are portions of leadframes that are bonded (col. 1, lines 53–55 and col. 2, lines 31–32) to a "template" 14 (col. 8, line 56) by one or more insulation layers 14A–14C (also called "castellated seal rings" at col. 8, line 53). Each of leads 13A–13K is of a unitary construction that is "bent" (see col. 5, line 58) into an "L" shape, with a first leg attached to a layer 14I and a second leg passing through substrate 14 to protrude into a region 15 on the exterior of package 10.

SUMMARY OF THE INVENTION

The speed of transmission of an electrical signal through an integrated circuit package is increased according to the principles of this invention by reducing the dielectric constant of a material that surrounds an electrical conductor that carries the signal. Specifically, an integrated circuit package (also referred to as "package") of this invention includes a number of electrical conductors that are surrounded either completely or at least partially by a gas (such as air). The gas has a dielectric constant that is several times lower (e.g. 2–3 times lower) than the dielectric constant of a solid substrate (e.g. formed of plastic or ceramic) that conventionally surrounds such electrical conductors.

In a first embodiment, the electrical conductors are leads initially formed as portions of a lead frame, and are held separated (e.g. elevated) from a substrate by a number of electrically conductive support members that are attached to the substrate. The support members are separate and distinct from the leads, and are mounted transverse (e.g. perpendicular) to the substrate (in a manner similar or identical to electrically conductive pins or electrically conductive balls mounted on an exterior surface of a conventional pin grid array package).

Each support member is electrically coupled to a corresponding lead by an electrically conductive joint, and holds the lead approximately parallel to the substrate. In one implementation, such a conductive joint is formed by shrink fitting a lead having a hole onto a corresponding pin. In alternative implementations, each lead is joined to a corresponding pin by a conductive joint formed by, e.g. soldering, brazing, thermocompression or by an electrically conductive glue.

The electrically conductive support members (such as pins) are electrically coupled (e.g. by traces and vias in the substrate) to electrically conductive terminals (e.g. pins, balls or lands) located on an exterior surface of the package. The leads are electrically coupled in the normal manner (e.g. by bond wires) to a semiconductor die that is supported by the package. Therefore in the first embodiment, each lead of a package is completely surrounded by a gas e.g. dry air.

As noted above, the leads are formed as portions of a lead frame that is in turn formed e.g. by etching or stamping a sheet of conductive material, e.g. copper. The leads are initially connected to a tie bar ring (included in the lead frame) that holds the leads in place relative to one another. After a conductive joint is formed between each lead and a corresponding support member (as described above), the leads are severed from the tie bar ring, and are held in place by the conductive joints. Thereafter, each lead is electrically coupled to a corresponding pad on the semiconductor die, e.g. by wire bonding.

In a second embodiment, a solid material (having no internal cavities) normally used in a conventional substrate is replaced partially (i.e. not completely as described above) by a gas, e.g. air. In two implementations of the second embodiment, a substrate is formed of either foam (e.g. plastic having bubbles of gas entrapped therein) or a mesh (e.g. interwoven strands of graphite or nylon) both of which have a lower dielectric constant than a solid substrate. Therefore, in the second embodiment, the package has electrical conductors passing through a non-solid substrate.

A third embodiment combines the above-described features of the first and second embodiments. Specifically, each lead is completely surrounded by air (as described above in reference to the first embodiment), and each lead is attached to a pin that passes through a non-solid substrate such as a foam substrate or a mesh substrate (as described above in reference to the second embodiment). Thus the third embodiment minimizes the dielectric constant in all regions surrounding an electrical path between a die pad and an external terminal of the package.

BRIEF DESCRIPTION OF THE DRAWINGS

FIGS. 2D, 2E, and 2F illustrate, in a plan view, and two elevation views respectively, steps in the fabrication of the integrated circuit package of FIGS. 2A and 2B.

FIG. 2G illustrates, in a perspective view, formation of a shrink-fit joint between a pin having a head and a lead having a hole of the same shape as the head.

FIGS. 3A–3I illustrate, in cross-sectional elevation views, nine different variations of the integrated circuit package illustrated in FIGS. 2A–2B.

DETAILED DESCRIPTION

According to the principles of this invention, a solid substrate (formed of, e.g., a plastic or a ceramic) that conventionally supports electrical conductors (such as leads and vias) in an integrated circuit package is replaced either partially or completely by a gas having a dielectric constant that is several times lower (e.g. two times lower) than the dielectric constant of the solid substrate. Therefore, an electrical signal carried by an electrical conductor of the package propagates faster than in the prior art.

Use of a gas as described herein also reduces the capacitance of an electrical conductor because of the just-described lower dielectric constant in the region surrounding the electrical conductor. Moreover, use of a gas eliminates thermal stresses otherwise created by differential rates of expansion between a lead (conventionally formed of a metal) and a substrate (conventionally formed of plastic or ceramic) to which the lead is normally attached.

Figure 2A:
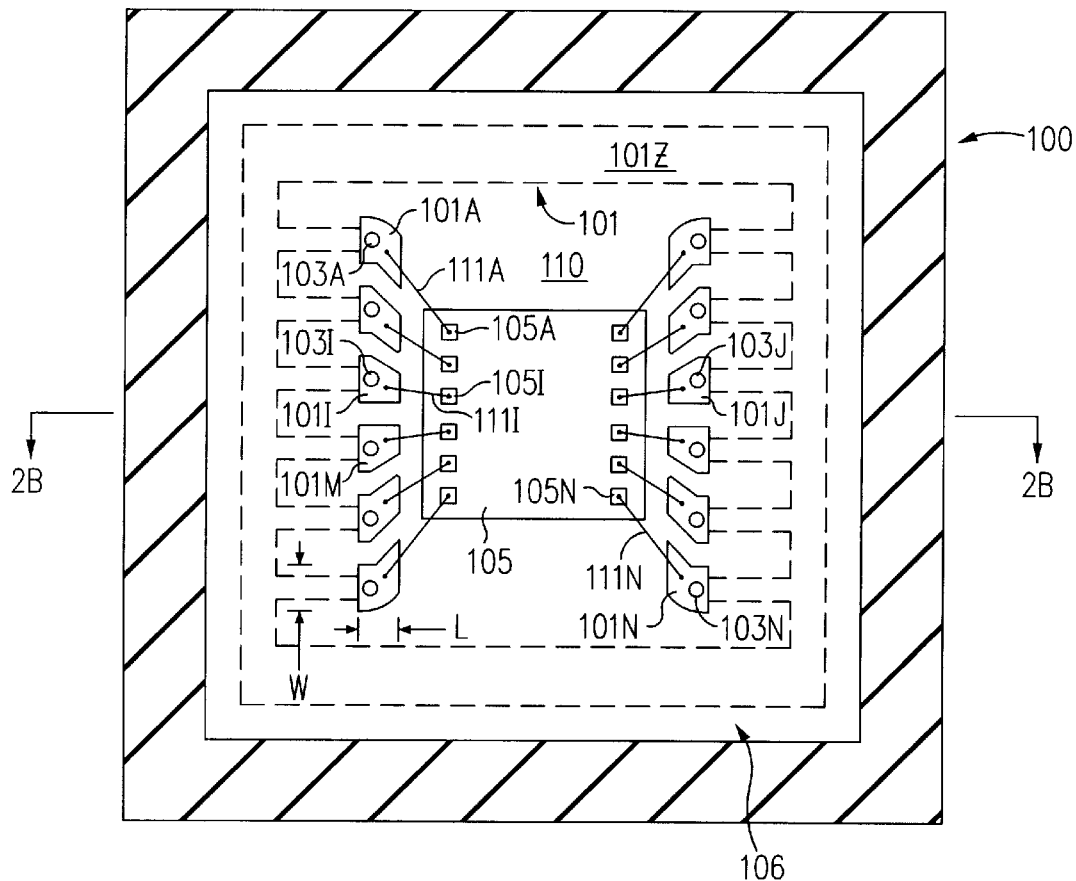
FIGS. 2A and 2B illustrate, in a cross-sectional plan view and a cross-sectional elevation view respectively, an integrated circuit package in one embodiment of this invention.

In one embodiment, an integrated circuit package 100 (FIGS. 2A and 2B) includes a number of electrically conductive leads 101A–101N (where $A \leq I \leq J \leq N$, N being the total number of leads) that are completely surrounded by a gas 110 (such as air). Leads 101A–101N are held separated (e.g. elevated in the orientation in FIG. 2B) from an underlying substrate 104 by a corresponding number of pins 103A–103N (FIG. 2A). Substrate 104 is formed of a solid dielectric material, e.g. bismaleimidle-triazine (BT) resin or any other solid material normally used to form an integrated circuit package.

Leads 101A–101N are also connected by a corresponding number of bond wires 111A–111N (FIG. 2A) to a corresponding number of die pads 105A–105N on a semiconductor die 105. Die 105 is attached to an inner side 104I (FIG. 2B) of substrate 104, for example, by an adhesive (not labeled) in the normal manner. Inner side 104I forms a surface of cavity 106, and each pin 103I protrudes out of substrate 104 into cavity 106.

In this embodiment, each pin 103I has a height Hi (of, e.g. 0.03 inch) that is greater than the height Hd (of, e.g. 0.02 inch) of semiconductor die 105. In this particular embodiment, each pin 103I is mounted perpendicular to an inner side 104I (FIG. 2B) of substrate 104. Pins 103A–103N can be mounted in substrate 104 by a process similar or identical to the normal brazing process commonly used to attach pins to an external surface of a pin grid array package (except that in FIG. 2B pins 103A–103N are located inside cavity 106). One such brazing process is described in, for example, Chapter 1 of "Multilayer Ceramics" available from KYOCERA Corporation, 1740 Technology Dr., Suite 490, San Jose, Calif. 95110.

Integrated circuit package 100 can be a pin grid array package, wherein each pin 103I passes completely through substrate 104. In such an implementation, each pin 103I protrudes from both sides, inner side 104I and outer side 104E of substrate 104. Specifically, each pin 103I is of a unitary construction that has three portions: a first portion of height Hi in cavity 106, a second portion of a height equal to the thickness Ts of the bottom portion of substrate 104, and a third portion of height He in an external region 109 outside package 100. In this embodiment each pin 103I is collinear (i.e. straight), and is a discrete piece that is separate and distinct from another pin 103J.

Figure 1A:
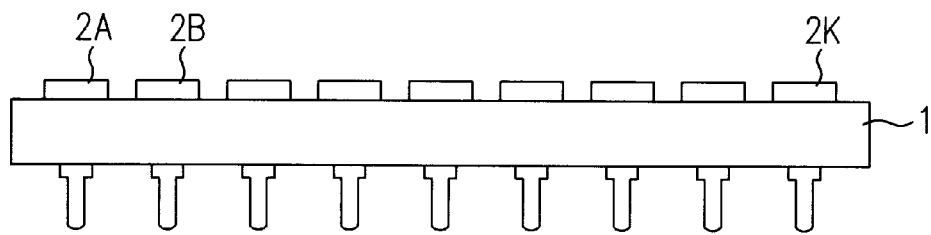
FIGS. 1A and 1B illustrate, in a cross-sectional view and an elevation view respectively, integrated circuit packages of the prior art.
Figure 1B:
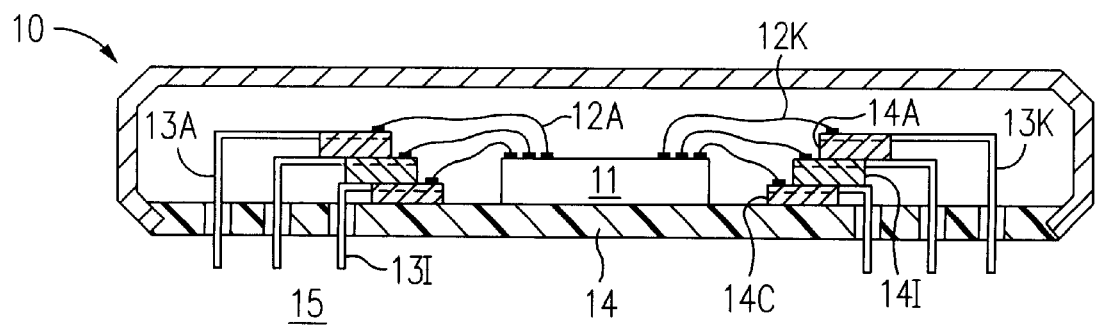

Each pin 103I is also separate and distinct from each lead 101I, unlike the unitary construction of a prior art lead 13I that may replace a pin (as described above in reference to FIG. 1B). Use of pins 103A–103N that are distinct from leads 101A–101N allows pins 103A–103N to be mounted in substrate 104 independent of leads 101A–101N. Specifically, in one implementation, each pin 103I is mounted sufficiently parallel to another pin 103J, to ensure that the ends (not labeled in FIG. 2B) of a majority (e.g. greater than 50%) of pins 103A–103N in exterior region 109 are coplanar.

Use of such discrete pins 103A–103N eliminates the prior art bending of leads 13A–13N (FIG. 1B), and the related use of a forming tool that may destroy the coplanarity of the ends of leads 13A–13K in exterior region 15. Loss of such coplanarity poses a problem in the mounting of prior art package 10 (FIG. 1B) on a printed circuit board. Such a prior art problem is overcome by the above-described use of discrete pins 103A–103N because the discrete nature allows pins 103A–103N to be mounted independent of leads 101A–101N, and therefore eliminates the need to use a forming tool that causes the problem.

In this embodiment, leads 101A–101N (FIG. 2A) are formed as N separable portions of a lead frame 101. Lead frame 101 is formed in the normal manner by stamping or etching a sheet of metal, such as copper (e.g. of thickness thickness T of 0.006 inch). In addition to leads 101A–101N, lead frame 101 of this embodiment includes a tie bar ring 101Z (shown by dashed lines in FIG. 2A) that holds leads 101A–101N in place relative to one another during fabrication of the package.

Each lead 101I can be physically attached to and electrically connected to a respective electrically conductive pin 103I by any method that results in an electrical connection (also called "conductive joint") therebetween, e.g. by shrink-fit, soldering, brazing, thermocompression or by an electrically conductive glue. At the end of such attachment, leads 101A–101N are preferably (but not necessarily) coplanar, e.g. the center of each lead 101I is located in a common plane 520 (shown as a dashed line in FIG. 2B) that is parallel to surface LOSS (that contains die pads 105A–105N) of die 105.

Figure 2B:
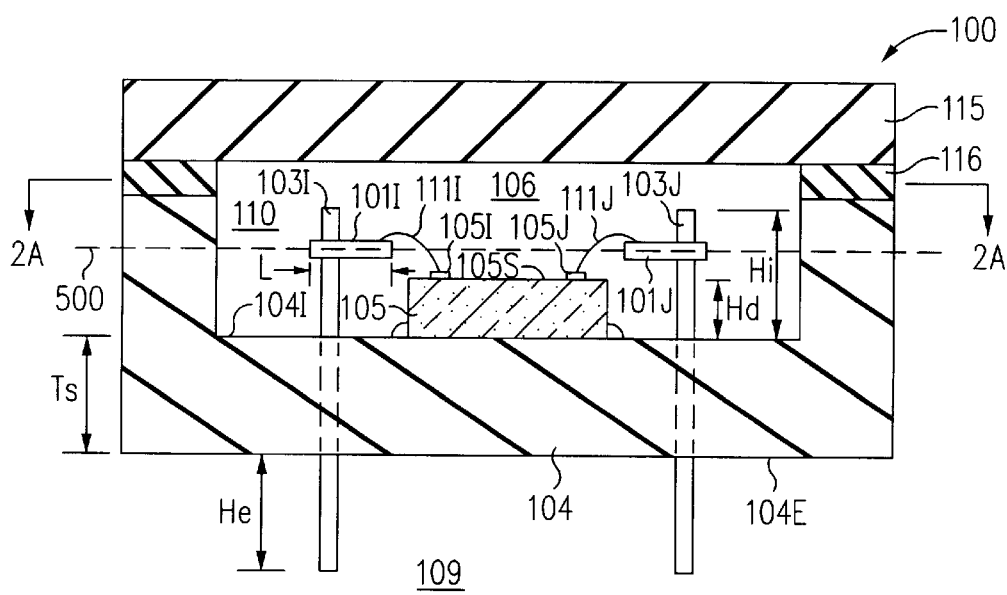
Figure 2C:
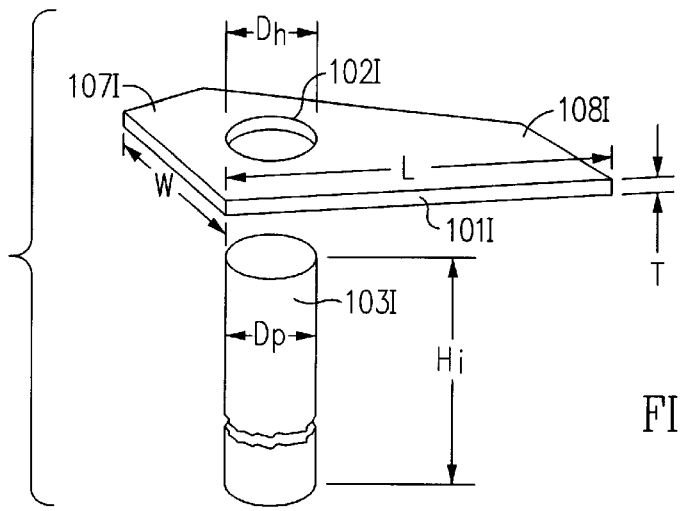
FIG. 2C illustrates, in a perspective view, formation of a shrink-fit joint between a lead and a pin of FIGS. 2A and 2B.

In a shrink-fit example, each pin 103I has a circular cross-section, and each lead 101I has a circular hole 102I (FIG. 2C) located at a first end (also called "outer end") 107I of lead 101I. The diameter Dh (of, e.g. 0.016 inch) of hole 102I is slightly smaller (e.g. 2% smaller) than a diameter Dp of a corresponding pin 103I that is mounted in a substrate 104 (FIG. 2B). During fabrication, each lead 101I (in one embodiment the entire lead frame 101) is heated (e.g. to 500° C.), until diameter Dh becomes larger (e.g. 2% larger) than the diameter Dp (because pin 103I remains at room temperature).

Lead frame 101 (FIG. 2A) can be heated by any method, e.g. conduction heating by connection to two clips (not shown) of a heater block if lead frame 101 is made of a good conductor of heat, such as copper. Heat from the heater block's clips is conducted by tie bar ring 101Z (FIG. 2A) to each of leads 101A–101N. In this manner, the entire lead frame 101 (including all leads 101A–101N) is heated to a temperature of, for example, 500° C.

Alternatively, lead frame 101 can be heated by a glass plate 120 (FIG. 2D) having grooves 121 and 122 (FIGS. 2D, 2E and 2F) that are located underneath holes 102A-102N in leads 101A–101N, thereby to accommodate insertion of pins 103A–103N (FIGS. 2A and 2B). Glass plate 120 and lead frame 101 are together heated on a heater block (hereinafter "preheater block") 130 (FIG. 2E) up to a temperature that is half (e.g. 250° C.) of the final temperature. Thereafter glass plate 120 and lead frame 101 are moved to another heater block 140 (FIG. 2F) and heated to the final temperature (e.g. 500° C.).

In another heating method, tie bar ring 101Z (FIG. 2A) is heated by resistance heating, e.g. by connection between two electrodes, while a current (e.g. 100 amps) is passed through tie bar ring 101Z. To ensure that tie bar ring 101Z heats up, tie bar ring 101Z is etched to a thickness (of e.g. 0.003 inch) that is one half of thickness T (e.g. 0.006 inch) of leads 101A–101N. The heated tie bar ring 101Z in turn heats up leads 101A–101N by conduction.

Next, lead frame 101 is aligned to substrate 104 (FIG. 2F) e.g. by an optical alignment system 150. Examples of optical alignment systems include Cognex Vision System, model "Checkpoint 90C." available from Cognex Corporation, OneVision Drive, Natick, Mass. 01760. Specifically, lead frame 101 is moved by a motion control machine (e.g. model "M-MFN08CC" with MM2000RX controller available from Newport Corporation, Irvine, Calif.) until pins 103A–103N are aligned with corresponding holes 102A–102N (FIG. 2D) in the respective leads 101A–101N.

The precision required during alignment depends on the difference Dp–Dh in the respective diameters of each pin 103I and a respective hole 102I (FIG. 2C) of lead 101I, that in turns depends on the difference in temperatures of pin 103I and lead 101I. For example, if lead 101I is made of copper and is heated to a temperature of 50020 C., and pin 103I remains at a room temperature of 27° C., there is a 2% difference in diameters (assuming that at room temperature diameter Dh is smaller than diameter Dp by 2%). Therefore, lead frame 101 must be aligned to substrate 104 to within the 2% difference in diameters.

Pin 103I is preferably made of Kovar (an alloy of iron, nickel and cobalt) that is available from, e.g. KYOCERA Corporation, 1740 Technology Drive, Suite 490, San Jose, Calif. 95110. An allowance for the shrinkage fit of a pin 103I in a hole 102I can be provided by the skilled artisan in view of the disclosure, e.g. as described in pages 626–629 of "Machinery's Hand Book", 23rd Revised Edition by J. M. Amiss, Franklin D. Jones and Henry H. Ryffel, Industrial Press Inc., 200 Madison Ave., New York, N.Y., 1988. These pages are incorporated by reference herein in their entirety.

Figure 2D:
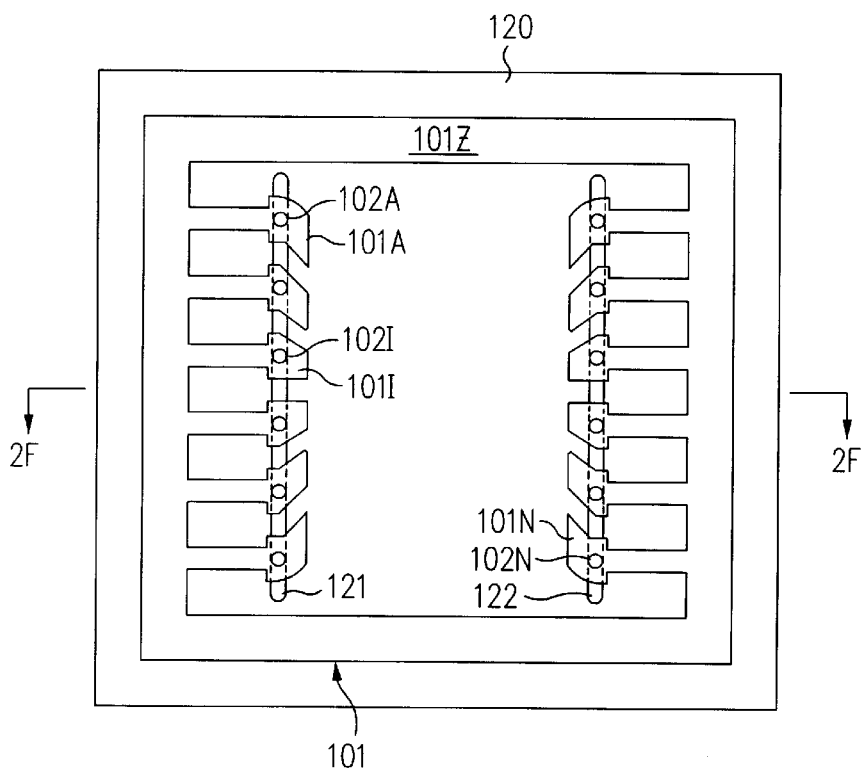
Figure 2E:
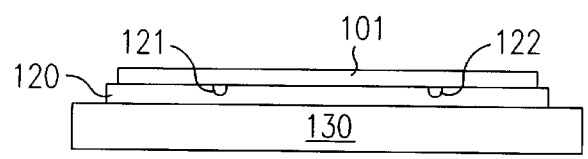

After alignment (as described above), substrate 104 (having pins 103A–103N attached thereto) is moved (e.g. vertically) towards lead frame 101 (FIG. 2F), until pins 103A–103N pass through corresponding holes 102A–102N (not shown in FIG. 2F; see FIG. 2D). If glass plate 120 is used, the movement is stopped when pins 103A–103N touch grooves 121 and 122. Next, lead frame 101 is cooled or allowed to cool, and on reaching room temperature each lead 101I shrink fits onto a respective pin 103I. Thereafter, tie bar ring 101Z is severed from leads 101A–101N (FIG. 1A), and leads 101A–101N remain in place, each coplanar with the other due to attachment to the respective pins 103A–103N.

Preferably, but not necessarily, each pin 112I (FIG. 2G) has an alignment feature, e.g. a head 112H of a non-circular (e.g. square) cross-section that is attached to (e.g. formed on) a cylindrical stem 112S. Head 112H has a height Hh (of, e.g. 0.010 inch), and each side has a width Wp (of, e.g. 0.006 inch). Head 112H keeps a corresponding lead 113I that has a square hole 114I from rotating around pin 112I after insertion of head 112H into hole 114I. Such rotation can occur when a hole 102I is circular if a corresponding lead 101I does not form a joint on shrink fitting, e.g., due to a design flaw or manufacturing flaw. Therefore, prevention of rotation may be necessary to keep a lead 101I (FIG. 2A) from rotating and touching adjacent lead 101M, for example during wire bonding or during normal use by an end user (e.g. during operational vibration and shock from normal handling).

However, instead of having a square cross-section head 112H as illustrated in FIG. 2G, pins to be mounted inside a cavity 106 (FIG. 2B) can have heads of other non-circular cross-sections, e.g. a star cross-section (not shown) that also keeps a corresponding lead from rotating. Moreover, instead of a head, another alignment feature, e.g. a key (not shown) can be formed along a portion of an otherwise cylindrical pin, also to prevent rotation of a lead having a corresponding slot.

After formation of a conductive joint between each pin 103I and a corresponding lead 101I (for example by shrink fit as described above), each lead 101I is electrically coupled to a corresponding die pad 105I (FIGS. 2A and 2B) on die 105 by bond wires 111A–111N that are formed by a wire bonding machine in the normal manner. In this particular embodiment, the length L (FIGS. 2A–2C) of each lead 101I is up to several times smaller (e.g. 3 times smaller) than the height Hi (FIGS. 2B and 2C) of the corresponding pin 103I. Therefore, lead 101I withstands (e.g. deforms elastically and springs back) the pressure (e.g. 50–100 grams) applied by a wire bonding machine during the bonding of a corresponding bond wire 111I to lead 101I.

After all bond wires 111A–111N are formed (as described above), a lid 115 is attached to substrate 104, for example by use of an adhesive 116 (FIG. 2B), thereby to seal cavity 106. In this embodiment, substrate 104 (FIG. 2B) is formed of a solid dielectric material (such as polyimide or ceramic) and has a number of through holes (not labeled) to hold pins 103A–103N. Package 100 includes an adhesive (not shown) that seals the holes at surface 104E thereby to hermetically seal cavity 106.

Hence, cavity 106 protects leads 101A–101N, die 105 and bond wires 111A–111N from the external environment (e.g. moisture in region 109 of FIG. 2B). As noted above, each pin 103I has, inside cavity 106, a first portion that is connected to lead 101I, and has, in region 109, a third portion that is connected to traces on a printed circuit board (not shown).

On completion of fabrication, package 100 has a number of leads 101A–101N that are held separated from substrate 104 by the corresponding pins 103A–103N. Therefore, leads 101A–101N are completely surrounded by air 110. That is, each of leads 101A–101N does not touch any solid dielectric material in package 100. Air 110 has a relative dielectric constant, e.g. 1.003, that is several times lower (in this particular example, more than four times lower) than the relative dielectric constant 4.5 of a substrate of plastic.

Next, package 100 is used in the normal manner, e.g. each pin 103I is mounted in a hole (not shown) in a printed circuit board. Each pin 103I being a discrete piece (separate and distinct from each lead 101I) allows each pin 103I to have a circular cross-section that provides backward compatibility with circular holes in conventional printed circuit boards. In contrast, the unitary construction of a prior art lead 13I (FIG. 1B) may result in, for example, a rectangular cross-section that is incompatible with circular holes of a conventional printed circuit board.

When package 100 is mounted on a printed circuit board, leads 101A–101N are coupled by pins 103A–103N (that protrude into region 109) to traces on the printed circuit board. Use of pins 103A–103N to hold leads 101A–101N separated from substrate 104 (as described above) minimizes the dielectric constant in the region surrounding each lead 101I.

Such minimization of the dielectric constant allows an electrical signal to propagate faster through package 100 than propagation of an electrical signal through a conventional integrated package of the type described above in reference to FIGS. 1A and 1B. Specifically, during the transmission of an electrical signal, an electrical field surrounds a lead 101I. The electrical signal propagates on the surface of lead 101I at the speed of light divided by the square root of the relative dielectric constant of the material that encapsulates lead 101I. Therefore, the speed of transmission of an electrical signal through lead 101I depends on the dielectric constant of the material in a distance (e.g. 40 mils for a 8 mil diameter lead) around lead 101I. One embodiment of package 100 results in a 100% improvement in speed of transmission of an electrical signal over the prior art, because a solid dielectric material slows down the signal's speed by 50% compared to air.

The above-described use of air 110 to completely envelope leads 101A–101N also reduces the capacitance of leads 101A–101N because of the lower dielectric constant of air 110 as compared to the dielectric constant of a conventional substrate formed entirely of plastic. Moreover, use of air 110 to completely surround lead 101I eliminates thermal stresses in lead 101I otherwise created by the differential rates of expansion between a lead 13I (FIG. 1B) and an attached substrate e.g. layer 14A (FIG. 1B) that is formed of e.g. plastic.

Figure 3C:
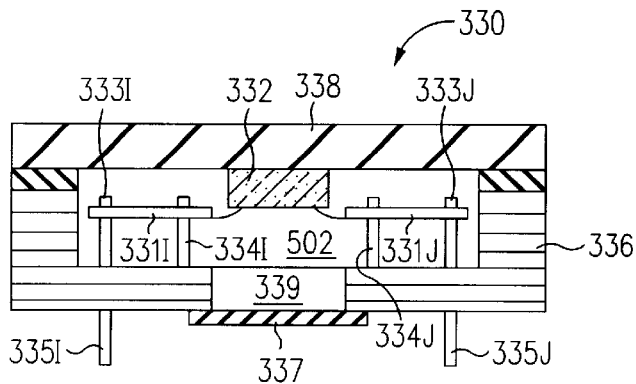

Instead of forming a hermetically sealed cavity 106, as described above in reference to FIGS. 2A–2B, in another package 310 (FIG. 3A), an encapsulant 311 protects die 305. Encapsulant 311 can be formed, for example, by transfer molding. Prior to transfer molding, die 305 can be coated with spin-on polyimide to protect die 305 from moisture. Such encapsulation is described, for example in Chapter 8 entitled "plastic Packaging" and in Chapter 10 entitled "Package Sealing and Encapsulation" in the book entitled "Microelectronics Packaging Handbook" edited by Rao R. Tummala, and Eugene J. Rymaszewski and published by Van Nostrand Reinhold, New York, 1989, pages 523–672 and pages 727–777. These pages are incorporated by reference herein in their entirety. All other components of package 310 are assembled in a manner similar or identical to that described above for package 100 (in reference to FIGS. 2A–2G).

In another package 320 (FIG. 3B), the leads (e.g. leads 321I and 321J in FIG. 3B) cannot withstand (e.g. deforms plastically due to) the pressure applied by a wire bonding machine (not shown). Therefore, a ring 322 (shown in dashed lines in FIG. 3B) is mounted on substrate 324, underneath each lead 321I, thereby to support each lead 321I during wire bonding. Ring 322 is preferably (but not necessarily) removed from substrate 324 after completion of wire bonding.

Ring 322 is significantly different from layers 14A–14C described above (in reference to prior art package 10 in FIG. 1A) for a number of reasons. For example, ring 322 is not attached, either permanently or temporarily to the leads, e.g. leads 321I and 321J in FIG. 3B. Instead, ring 322 merely keeps leads 321I and 321J from collapsing during wire bonding. At the end of wire bonding, ring 322 is preferably removed (as described below), and therefore is not a critical part of package 320. Moreover, ring 322 can be formed of any material, e.g. a conductive material or a dielectric material, because ring 322 is not used after wire bonding.

In one particular embodiment, ring 322 is formed of a material that can withstand the temperature of wire bonding (e.g. 200° C.), and that can be disintegrated, e.g. dissolved ih a solvent after the wire bonding, thereby to remove ring 322 from package 320. In one variant, the material of ring 322 is a composite, formed of filler particles (such as sand particles) dispersed in an adhesive. The particles and the adhesive are both resistant to heat at the wire bonding temperature. In another variant, ring 322 is devoid of the filler particles (e.g. formed of only the adhesive, by applying a number of layers to build up the thickness).

The adhesive included in ring 322 is degradable, e.g. (1) by dissolution in a solvent (such as water), or (2) by crumbling into a powder when heated to a temperature (e.g.

300° C) that is higher than the wire bonding temperature. Examples of one or more such adhesives are (1) water-soluble resin compositions as described in U.S. Pat. No. 4,035,332, (2) a polyimide that is soluble in an organic solvent as described in U.S. Pat. No. 5,480,965 and (3) an alkali-soluble resin and resin compositions as described in U.S. Pat. No. 5,723,262; each of these three patents is incorporated by reference herein in its entirety. Other such adhesives are described in U.S. Pat. No. 5,438,165, 5,532, 292, 5,519,177, 4,388,388 and 5,502,158.

In an alternative embodiment, ring 322 is not removed from substrate 324 on completion of wire bonding. Instead, ring 322 becomes a part of package 320. In the alternative embodiment, ring 322 does not touch the leads (e.g. leads 321I and 321J). That is, leads 321I and 321J are completely surrounded by air, as described above in reference to FIG. 2B. Each lead 321I flexes and touches ring 322 only during wire bonding and thereafter reverts back to plane 520 in FIG. 2B thereby to remain coplanar with every other lead 321J. Hence, in the alternative embodiment, ring 322 has a height Hr (FIG. 3B) that is smaller than the distance of each lead 321J from an inner surface 324C of substrate 324. If ring 322 is left in package 320, ring 322 is formed of a dielectric material to eliminate the possibility of accidentally shorting two leads 321I and 321J through ring 322.

In package 320 (FIG. 3B), substrate 324 is a multilayered substrate formed of a number of layers 324A–324M (where A≦I≦M, M being the total number of layers), for example by lamination of a number of interleaved sheets of conductive material (e.g. copper) and non-conductive material (e.g. polyimide) in the normal manner. Therefore, in this particular embodiment, pins 323I and 323J (FIG. 3B) do not pass through substrate 324, into external region 309. Instead pins 323I and 323J are located entirely in cavity 306 and are coupled in the normal manner (e.g. by via 326I and trace 327I in substrate 324) to terminals (e.g. pins 325I and 325J) attached to an external surface 324E of substrate 324. Use of such a multilayered substrate 324 eliminates the need for through holes (described above), and the attendant need to seal such holes.

In yet another embodiment, a package 330 (FIG. 3C) includes, inside cavity 302, two sets of pins: a second set of pins, e.g. pins 334I and 334J that are in addition to a first set of pins, e.g. pins 333I and 333J. Each pin 334I in the second set is located closer to die 332 than each pin 333I in the first set. Each lead 331I has two ends that are supported as follows: (1) an inner end (not labeled in FIG. 3C) supported by a corresponding pin 334I in the second set and (2) an outer end (also not labeled) supported by a corresponding pin 333I in the first set.

Hence, integrated circuit package 330 (FIG. 3C) having each lead 331I mounted on two conductive pins 333I and 334I has twice the number of pins (e.g. 2N) as compared to the number (e.g. N) otherwise required (as described above in reference to FIG. 2B). The additional N pins in the second set, if made of a conductive material, add capacitance and may introduce noise into the electrical signals passing through the package. Therefore, in one variant, each pin 334I in the second set is formed of a dielectric material, such as polyimide.

In another variant, each pin 334I in the second set is formed of a conductive material (such as Kovar). However, each such pin 334I is preferably (but not necessarily) connected by an electrical path (e.g. by traces and vias not shown in FIG. 3C) in substrate 336 to a corresponding external terminal (e.g. pin 335I), in a manner similar or identical to an electrical path between pin 333I of the first set and the external terminal. Therefore, in this variant there are two parallel electrical paths between a die's terminal and an external terminal of the integrated circuit package.

The inductance Ltot of the combination of the two parallel electrical paths is smaller than the inductance of a single electrical path, and depends on the distance between the two electrical paths. In one implementation, the electrical paths are separated each from the other by a distance sufficient to eliminate interaction between the two electrical paths, and the combined inductance is given by the following formula (wherein L1 and L2 are the inductances of the respective two parallel electrical paths):

$$\frac{1}{Ltot} = \frac{1}{L1} + \frac{1}{L2}$$

Therefore, if L1 and L2 are approximately equal, the inductance of the combination of the two electrical paths, Ltot, is one half of the inductance of a single electrical path.

However when the distance between the two electrical paths is reduced in another implementation, the electrical signals in the two paths interact, and the resulting inductance of the combination of the two parallel electrical paths can be computed by solving Maxwell's equations, as described in, for example, Section 9.1 entitled "TEM Wades on Transmission Lines", in "Electromagnetics for Engineers" by Steven E. Schwarz, Saunders College Publishing, a division of Holt, Reinhart and Winston, Inc., 1990 at pages 292–295. In one particular implementation, the inductance Ltot is less than the inductance of a single electrical path by 33% (rather than 50%) for pins e.g. of 8 mils diameter separated by a distance of, e.g. 8 mils. Such use of two parallel electrical paths results in an inductance smaller than the inductance of a single electrical path, barring any outside interaction with other electrical paths.

In package 330 (FIG. 3C), die 332 is mounted on a second substrate (also called a "mount") 338 that is separate and distinct from first substrate 336 on which all the pins, e.g. pins 333I, 334I, 333J, 334J, 335I and 335J are mounted. First substrate 336 has a hole 339 that is located opposite to die 332. Hole 339 is used during wire bonding to form wire bonds (not labeled in FIG. 3C) between die 332 and corresponding leads 331I and 331J. After wire bonding, hole 339 is sealed by a lid 337 in the normal manner. Mount 338 is formed preferably of a thermally conductive material, such as a copper slug, thereby to dissipate heat generated during the operation of die 332.

Figure 3D:
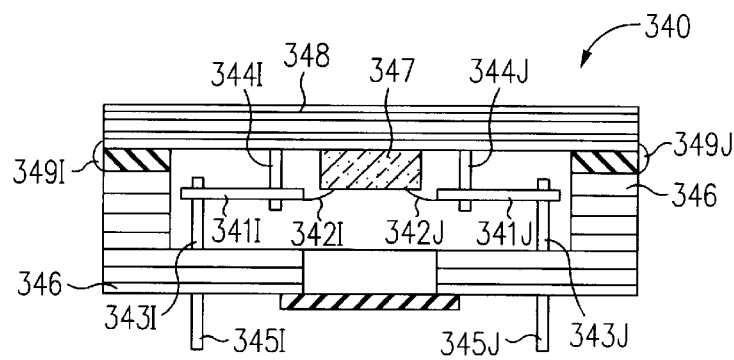

Instead of all pins being mounted on first substrate 336 (FIG. 3C), in another embodiment, a package 340 (FIG. 3D), has a second set of pins (e.g. pins 344I and 344J) that are mounted on mount 348, adjacent to die 347, while a first set of pins (e.g. pins 343I and 343J) are mounted on substrate 346. In one variant of this embodiment, pins 344I and 344J in the second set are non-conductive, for example formed of a polyimide, while mount 348 is formed of a thermally conductive material (such as a copper slug).

In another variant, a pin 344I and a pin 344J are both formed of a conductive material, e.g. Kovar, and mount 348 is formed of a number of layers of conductive and non-conductive material, for example by lamination. In this particular variant, pins 344I and 344J re electrically coupled to external terminals, e.g. pins 345I and 345J by traces and vias (not shown) formed respectively in mount 348, and in substrate 346 that are electrically coupled each to the other by solder bridges 349I and 349J of the type described briefly below and in detail in the commonly owned, copending U.S. patent application Ser. No. 08/370,048 that is incorporated by reference herein in its entirety.

Bridges 349I and 349J can be formed, for example by providing a small clearance between the surfaces of mount 348 and substrate 346 at the to-be-connected traces, and thereafter immersing mount 348 and substrate 346 in a solder bath. Surface tension of solder in the solder bath causes solder to span the clearance between (1) traces on mount 348 and (2) corresponding traces on substrate 346, thereby to form corresponding bridges 349I and 349J. The solder includes a conductive material, such as Sn or Pb, and is held at a temperature in the range of 225° C.–235° C.

Instead of using solder bridges 349I and 349J, traces on mount 348 and substrate 346 can be connected by solder balls of a ball grid array (BGA) implementation. Such solder balls (not shown) are formed on one of mount 348 and substrate 346, while the other of mount 348 and substrate 346 has corresponding pads. The pads are brought in contact with the solder balls, followed by reflowing of the solder balls by heating in an oven (not shown).

In yet another variant of this embodiment, pins 344I and 344J are replaced by a ring (not shown; similar or identical to ring 322 in FIG. 3B) of a dielectric material that is attached to mount 348. Preferably such a ring is separated from the leads (e.g. leads 341I and 341J), and can be either included as a part of a package, or only used temporarily during formation of bond wires (e.g. wires 342I and 342J) as discussed above in reference to FIG. 3B.

Figure 3E:
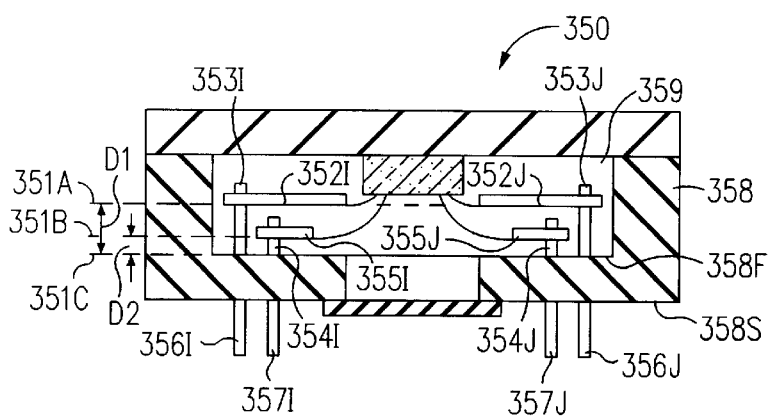

Yet another package 350 (FIG. 3E) includes two sets of leads (e.g. leads 352I and 355I) that are respectively supported in two different planes 351A and 351B (shown as dashed lines in FIG. 3E) by two sets of pins (e.g. pins 357I and 354I) mounted inside cavity 359 on floor 358F of substrate 358. Each of leads 352I and 355I in each set is electrically coupled to a respective one of pins 353I and 354I in the manner described above in reference to FIG. 2B. Each of pins 353I and 354I is respectively connected to a corresponding external terminal (e.g. to respective pins 356I and 357I) located on an external surface 358S of substrate 358.

In one variant of this embodiment, the pins inside cavity 359 are continuous with the respective pins attached to surface 358S, e.g. pin 353I and pin 356I are portions of a single pin of unitary construction that passes through substrate 358 as described above in reference to FIG. 2B. In another variant, each pin 353I is separate and distinct from a corresponding pin 356I, and pins 353I and 356I are coupled each to the other by traces and vias (not shown) formed in substrate 358.

Figure 3F:
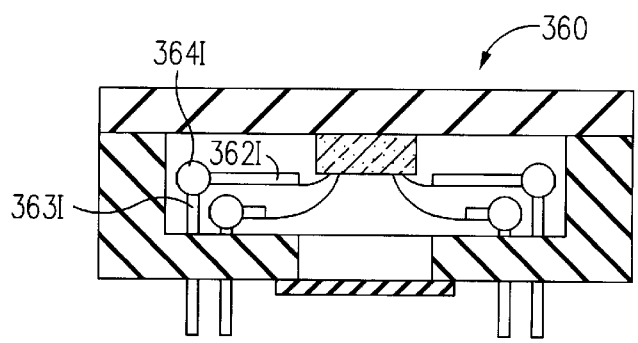

In various packages 100, 310, 320, 330, 340, and 350 described above, the conductive joints between support members and the respective leads are formed by shrink fit, and so the conductive joints do not require any material in addition to the materials of the support members and the leads. In another package 360 (FIG. 3F), each lead 362I is electrically coupled to a corresponding pin 363I by a conductive joint in the form of a ball 364I of conductive material formed, for example (1) of solder (e.g. a mixture of tin and lead) by soldering, or (2) of bronze (e.g. a mixture of 72% Ag and 28% Cu) by brazing. In one such embodiment, each lead 362I does not have a hole of the type described above in reference to FIG. 2C. Use of ball 364I in formation of a conductive joint between trace 362I and pin 363I is more reliable and provides greater surface area than a shrink fit joint (described above) because the use of ball 364I relies on a chemical reaction between the materials of the ball, the trace and the pin.

Figure 3G:
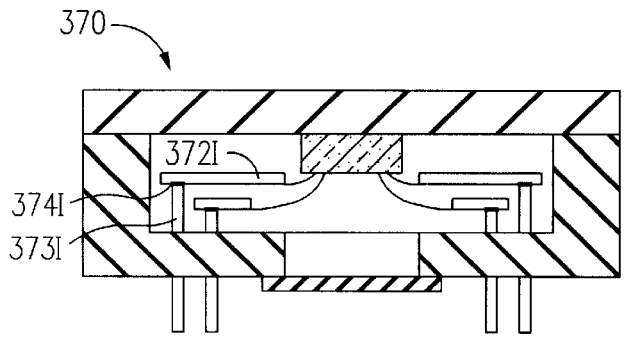

Instead of having a ball 364I, still another package 370 (FIG. 3G) includes a joint 374I between each lead 372I and a corresponding pin 373I, wherein joint 374I is formed, for example of gold by thermal compression. Therefore, package 370 has the advantage of using conventional Au wire and conventional bonding equipment, thereby eliminating the cost of special equipment.

Figure 3H:
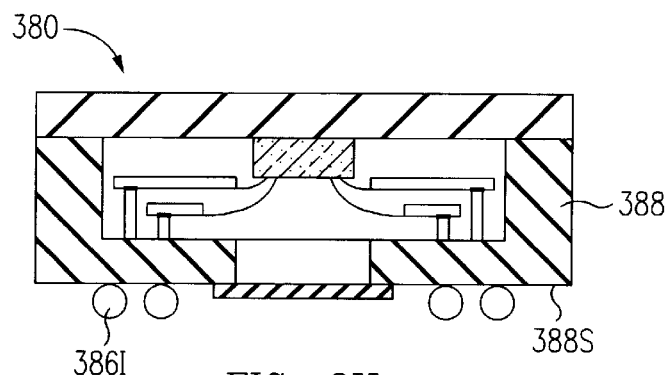

Although in the embodiments described above in reference to FIGS. 2B, and 3A–3G, each terminal (e.g. terminal 356I in FIG. 3E) that is formed on an external surface (e.g. surface 358S) is illustrated as a pin, any other terminal can be formed on an external surface of an integrated circuit package. For example, package 380 (FIG. 3H) includes a number of balls, e.g. ball 386I formed of a conductive material (such as solder) on an outer surface 388S of substrate 388 in a manner similar or identical to a ball grid array package, as described in, for example, Chapter 11 entitled "Package-To-Board Interconnections" in "Microelectronics Packaging Handbook" (described above), at pages 779–851 that are incorporated by reference herein in their entirety.

Furthermore, instead of having bond wires (e.g. bond wire 342I in FIG. 3D) between a die (e.g. die 347) and a lead (e.g. lead 341I) other types of electrical conductors can be used. For example, in still another package 390 (FIG. 3I), a conductive tape 393 (e.g. the product Anisolm tape, available from Hitachi Chemical Limited, 4 International Dr., Rye Brook, N.Y. 10573) is sandwiched between a die pad 392I on die 392 and a lead 391I. Conductive tape 393 of this embodiment includes a number of conductive balls, e.g. conductive ball 393I that electrically connects a die pad 392I to lead 391I. Ball 393I is surrounded by an adhesive 393Z that physically attaches ball 393I to lead 391I and to die 392. A conductive joint between lead 391I and a pin 394I is formed as described above in reference to, for example, FIG. 2B and FIGS. 3F–3H.

Figure 4A:
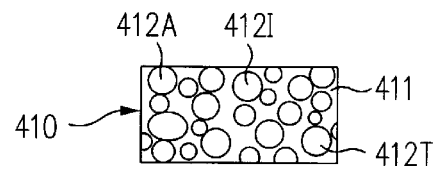
FIGS. 4A and 4B illustrate, in cross-sectional views, a non-solid substrate of this invention in the form of a foam and a mesh respectively.

Moreover, although in the embodiments described above in reference to FIGS. 2A–2G and 3A–3G, the substrate (e.g. substrate 104 in FIG. 2B) is formed of solid material, in another embodiment portions of such a solid material are replaced partially by a gas, for example air. Specifically, in one particular variant, substrate 314 (FIG. 3A) is formed of foam 410 (FIG. 4A) having a number of bubbles 412A–412T (wherein A≦I≦T, T being the total number of bubbles) of air entrapped in a body 411 of dielectric material, such as polyimide.

In another variant of this embodiment, substrate 314 (FIG. 3A) is formed of a mesh 420 (FIG. 4B) of strands 421A–421V (wherein A≦I≦V, V being the total number of strands). Strands 421A–421V are woven together to form mesh 420, and substrate 314 includes a number of layers (e.g. five layers) of mesh 420.

Figure 4B:
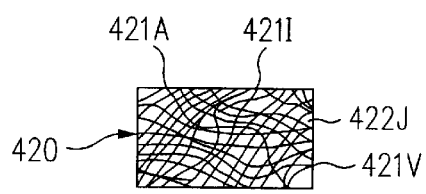

Use of foam 410 or mesh 420 to form a non-solid substrate 314 increases a signal's transmission speed through a pin 303I (FIG. 3A) surrounded by substrate 314 because of the lower dielectric constant of air e.g. in each bubble 412I (FIG. 4A), or alternatively in the spaces within the mesh 422J (FIG. 4B). Such use of air in non-solid substrate 314 also reduces the capacitance of each pin 303I, because of the lower dielectric constant of air as compared to the dielectric constant of a solid dielectric material, such as polyimide or ceramic.

The material used in mesh 420 (or in foam 410) can be e.g. solimide AC430 available from Imi-tech Corp, 538 Haggard Street, Suite 402, Plains, Tex. 75074. Such a material has a glass transition temperature Tg (e.g. 260° C.) that is greater than the temperature of the wire bonding step, e.g. greater than 150° C. Such a high glass transition temperature Tg keeps mesh 420 from disintegrating on exposure to heat generated during wire bonding.

In two variants, mesh 420 is formed as a cloth of strands that are formed of (1) Kevlar or (2) nylon or (3) graphite, all available from 3M Corporation, 3M Center, Saint Paul, Minn. 55144. Kevlar is preferred in one embodiment, because Kevlar is thermally conductive, and dissipates heat generated by die 305 (FIG. 3A) during operation.

In one particular embodiment, mesh 420 is impregnated with a thermo-setting epoxy (such as Able bond 84-3J available from Ablestick (a subsidiary of National Starch and Chemical Company), 20021 Susana Rd, Rancho Dominguez, Calif. 90221) after insertion of each pin 303I. Although such an epoxy reduces the number of interspatial spaces 422J, the epoxy may be required to hold the shape of the package and also to hold each pin 303I in place.

Figure 3I:
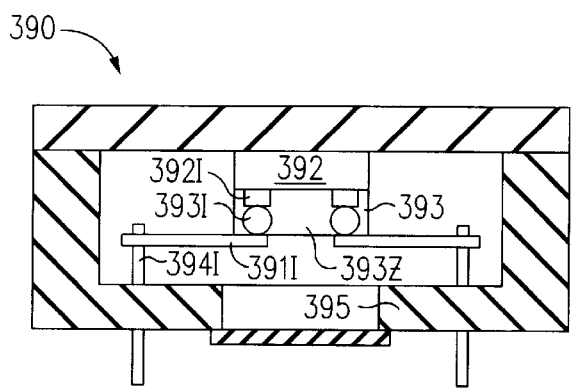

Numerous modifications and adaptations of the above-described embodiments will be apparent to a person skilled in the art of packaging integrated circuit dies, in view of the disclosure. For example, although substrate 314 (FIG. 3A) is described as being formed of a mesh, other substrates, e.g. substrate 358 (FIG. 3E) can also be formed of such a mesh, e.g. by molding. Moreover, the external terminals of a package are not limited to a ball 386I (FIG. 3H) and a pin 357I (FIG. 3E) as described above, and instead can be lands (not shown) of a land grid array package. Furthermore, although package 100 (FIG. 2A) includes pins 103A–103N as the support members, other types of support members, e.g. conductive balls surrounded by an adhesive included in a conductive tape can be used to support each lead 391I separated from substrate 395 (FIG. 3I). Accordingly, numerous modifications and adaptations of the above-described embodiments are encompassed by the attached claims.

What is claimed is:

1. An integrated circuit package comprising:
    a die;
    a first substrate;
    a plurality of support members mounted on said first substrate, each support member being formed of an electrically conductive material;
    a plurality of electrically conductive leads formed separate and distinct from said support members, each electrically conductive lead having a thickness and a width, said thickness being smaller than said width, each electrically conductive lead being held separate from said first substrate by at least one of said support members each electrically conductive lead lacking contact with any solid dielectric material; and
    a gas enveloping at least one of said electrically conductive leads.

2. The integrated circuit package of claim 1 wherein:
    said first substrate includes a non-solid material in the form of a foam or a mesh; and
    at least one of said support members passes completely through said non-solid material, said support member protruding out of each of a first side and a second side of said first substrate.

3. The integrated circuit package of claim 1 wherein:
    a first member in said plurality of support members is mounted transverse to a first side of said first substrate; and
    a first lead in said plurality of electrically conductive leads is parallel to said first side, said first lead being supported by said first member.

4. The integrated circuit package of claim 3 wherein said first member includes a pin, said pin being attached to a first end of said first lead, said integrated circuit package further comprising:

at least one additional pin mounted on said first side of said first substrate, said additional pin being attached to a second end of said first lead.

5. The integrated circuit package of claim 3 wherein:

said first lead has a hole; and said first member includes a pin, said pin being mounted in said hole.

6. The integrated circuit package of claim 5 wherein:

at room temperature said hole has a first dimension smaller than a second dimension of said pin.

7. The integrated circuit package of claim 6 wherein:

said hole has a non-circular shape;

said pin has a cross-section of said non-circular shape.

8. The integrated circuit package of claim 3 wherein:

said first lead is devoid of a hole;

said first member includes a pin; and said package includes:

a joint between said pin and said first lead, said joint including a material selected from the group of solder, bronze, gold, and electrically conductive glue.

9. The integrated circuit package of claim 1 wherein:

each of said support members includes a ball of conductive material.

10. The integrated circuit package of claim 1 wherein said first substrate has a hole, the integrated circuit package further comprising:

a second substrate located opposite to said first substrate;

said die having a plurality of pads, said die being mounted on said second substrate;

a plurality of bond wires, each bond wire having an end attached to a pad in said plurality of pads; and a lid mounted on said first substrate to seal said hole.

11. The integrated circuit package of claim 1 wherein:

each of said support members passes through said first substrate and protrudes out of each of a first side and a second side of said first substrate.

12. The integrated circuit package of claim 1 further comprising:

a die having a plurality of pads, said die being mounted on said first substrate; and a plurality of electrical conductors, each electrical conductor electrically coupling a pad to a second end of an electrically conductive lead.

13. The integrated circuit package of claim 12 wherein each of said electrical conductors includes a bond wire and said integrated circuit package further comprises:

a structure mounted on said first substrate, said structure being unconnected to any of said electrically conductive leads, said structure supporting at least one of said electrically conductive leads on flexing of said at least one electrically conductive lead during wire bonding.

14. The integrated circuit package of claim 1 wherein each of said electrically conductive leads is located at approximately a first distance from said first substrate, said integrated circuit package further comprising:

a plurality of additional leads, each additional lead being located at approximately a second distance from said first substrate, each additional lead being electrically coupled to a different one of said support members, each additional lead being enveloped by said gas.

15. An integrated circuit package for supporting a die, said integrated circuit package comprising:

a first substrate;

a plurality of support members mounted on said first substrate, each support member being formed of an electrically conductive material;

a plurality of electrically conductive leads separate and distinct from said support members;

a second substrate located opposite to said first substrate; and a structure of dielectric material attached to said second substrate, said structure being unconnected to any of said electrically conductive leads, said structure supporting at least one electrically conductive lead in said plurality on flexing of said electrically conductive lead during wire bonding.

16. An integrated circuit package for supporting a die, said integrated circuit package comprising:

a first substrate;

a plurality of support members mounted on said first substrate, each support member being formed of an electrically conductive material;

a plurality of electrically conductive leads separate and distinct from said support members;

wherein:

said first substrate includes a plurality of layers, and has a plurality of traces and vias formed therein;

each of said support members is mounted on a first side of said first substrate; and said integrated circuit package further comprises a plurality of additional support members, each of said additional support members being mounted on a second side of said first substrate, said second side being opposite said first side, each of said additional pins being electrically coupled by said traces and vias to at least one support member mounted on said first side.

17. The integrated circuit package of claim 16, wherein said first substrate includes a plate, the integrated circuit package further comprising:

an encapsulant for sealing said die.

18. An integrated circuit package for supporting a die, said integrated circuit package comprising:

a first substrate:

a plurality of support members mounted on said first substrate, each support member being formed of an electrically conductive material;

a plurality of electrically conductive leads formed separate and distinct from said support members;

a second substrate located opposite to said first substrate;

a die having a plurality of pads, said die being mounted on said second substrate;

a plurality of balls of conductive material, each ball being sandwiched between a pad and the second end of an electrically conductive lead, said ball being surrounded by an adhesive material that physically attaches said second end to said pad.

19. An integrated circuit package comprising:

a first substrate including a mesh; and a first plurality of electrically conductive leads passing completely through said mesh, each of said first plurality of electrically conductive leads protruding out of each of a first side and a second side of said substrate.

20. The integrated circuit package of claim 19, wherein:
at least one strand in said mesh is formed of strands of graphite or nylon.

21. The integrated circuit package of claim 19, further comprising:
a second plurality of electrically conductive leads formed separate and distinct from said first plurality of electrically conductive leads;
wherein at least one of said first plurality of electrically conductive leads holds at least one of said second plurality of electrically conductive leads separate from said substrate and said one of said second plurality of electrically conductive leads lacks contact with any solid dielectric material.

22. The integrated circuit package of claim 21, further comprising:
a second substrate located opposite to said first substrate;
a die having a plurality of pads, said die being mounted on said first substrate or said second substrate; and
a bond wire having an end attached to a pad in said plurality of pads and another end attached to one of said second plurality of electrically conductive leads.

* * * * *